United States Patent
Chang et al.

(10) Patent No.: US 9,570,302 B1
(45) Date of Patent: Feb. 14, 2017

(54) METHOD OF PATTERNING A MATERIAL LAYER

(71) Applicant: Taiwan Semiconductor Manufacturing Co., Ltd., Hsin-Chu (TW)

(72) Inventors: Shu-Hao Chang, Taipei (TW); Kuo-Chang Kau, Miaoli County (TW); Kevin Huang, Hsinchu (TW); Jeng-Horng Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/040,533

(22) Filed: Feb. 10, 2016

(51) Int. Cl.
*H01L 21/027* (2006.01)
*H01L 21/02* (2006.01)

(52) U.S. Cl.
CPC ....... *H01L 21/0274* (2013.01); *H01L 21/0271* (2013.01); *H01L 21/02118* (2013.01); *H01L 21/02172* (2013.01); *H01L 21/02307* (2013.01); *H01L 21/02343* (2013.01)

(58) Field of Classification Search
CPC .............. H01L 21/02118; H01L 21/02172; H01L 21/0274; H01L 21/02307; H01L 21/02343
See application file for complete search history.

(56) References Cited

U.S. PATENT DOCUMENTS

| | | | |
|---|---|---|---|
| 8,039,179 B2 | 10/2011 | Shieh et al. | |
| 8,202,681 B2 | 6/2012 | Lin et al. | |
| 8,728,332 B2 | 5/2014 | Lin et al. | |
| 8,822,243 B2 | 9/2014 | Yan et al. | |
| 2006/0091468 A1 | 5/2006 | Liaw | |
| 2009/0256144 A1* | 10/2009 | Kano | H01L 51/0012 257/40 |
| 2011/0281208 A1 | 11/2011 | Lin et al. | |
| 2012/0278776 A1 | 11/2012 | Lei et al. | |
| 2013/0295769 A1 | 11/2013 | Lin et al. | |
| 2013/0320451 A1 | 12/2013 | Liu et al. | |
| 2014/0193974 A1 | 7/2014 | Lee et al. | |
| 2014/0215421 A1 | 7/2014 | Chen et al. | |
| 2014/0242794 A1 | 8/2014 | Lin et al. | |
| 2014/0264760 A1 | 9/2014 | Chang et al. | |

(Continued)

OTHER PUBLICATIONS

Peter Thissen,, Tatiana Eixoto, Roberto C. Longo, Weina Peng, Wolf Gero Schmidt, Kyeongia Cho, and Yves, J. Chabal, Activation of Surface Hydroxyl Groups by Modification of H-Terminated Si(111) Surfaces.

(Continued)

*Primary Examiner* — Daniel Shook
(74) *Attorney, Agent, or Firm* — Haynes and Boone, LLP (57) ABSTRACT

A method of fabricating a semiconductor device is disclosed. The method includes forming a radiation-removable-material (RRM) layer over a substrate and removing a first portion of the RRM layer in a first region of the substrate by exposing the first portion of the RRM layer to a radiation beam. A second portion of the RRM layer in a second region of the substrate remains after the removing of the first portion of the RRM layer in the first region. The method also includes forming a selective-forming-layer (SFL) over the second portion of the RRM layer in the second region of the substrate and forming a material layer over the first region of the substrate.

20 Claims, 7 Drawing Sheets

(56) References Cited

U.S. PATENT DOCUMENTS

2014/0264899 A1  9/2014  Chang et al.
2014/0273442 A1  9/2014  Liu et al.
2014/0273446 A1  9/2014  Huang et al.

OTHER PUBLICATIONS

Fatemeh Sadat Minaye Hashemi, Chaiya Prasittichai and Stacey F. Bent, A New Resist for Area Selective Atomic and Molecular Layer Deposition on Metal-Dielectric Patterns, The Journal of Physical Chemistry, J. Phys. Chem. C 2014, 118, 10957-10962.

* cited by examiner

METHOD OF PATTERNING A MATERIAL LAYER

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, improvements in patterning a material layer are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
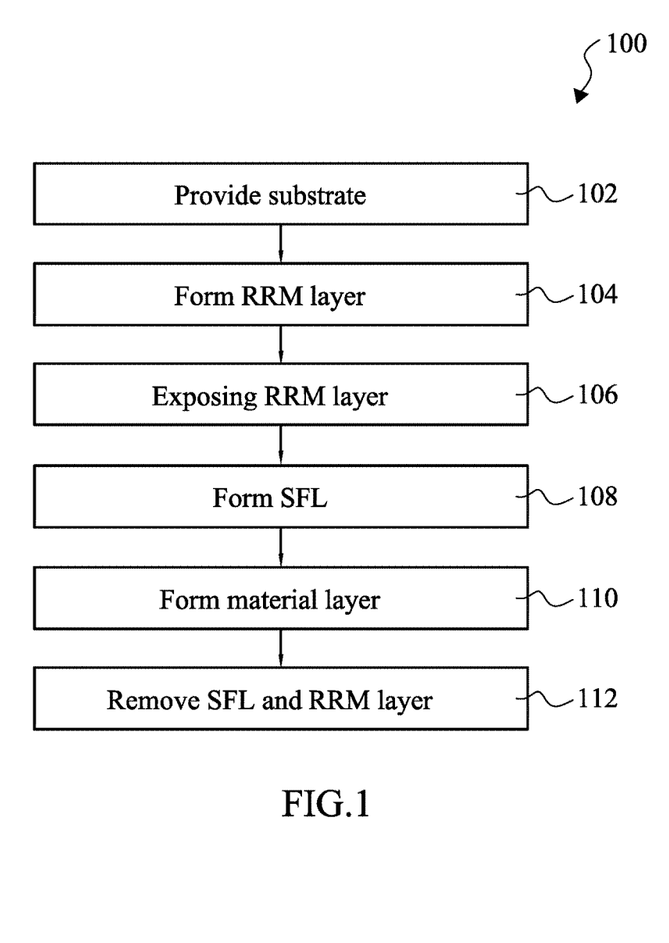
FIG. 1 is a flowchart of an example method for fabricating a semiconductor device constructed in accordance with some embodiments.

FIG. 1 is a flowchart of a method 100 of fabricating one or more semiconductor devices in accordance with some embodiments. The method 100 is discussed in detail below, with reference to a semiconductor device 200, shown in FIGS. 2, 3A, 3B, 4, 5 and 6.

Figure 2:
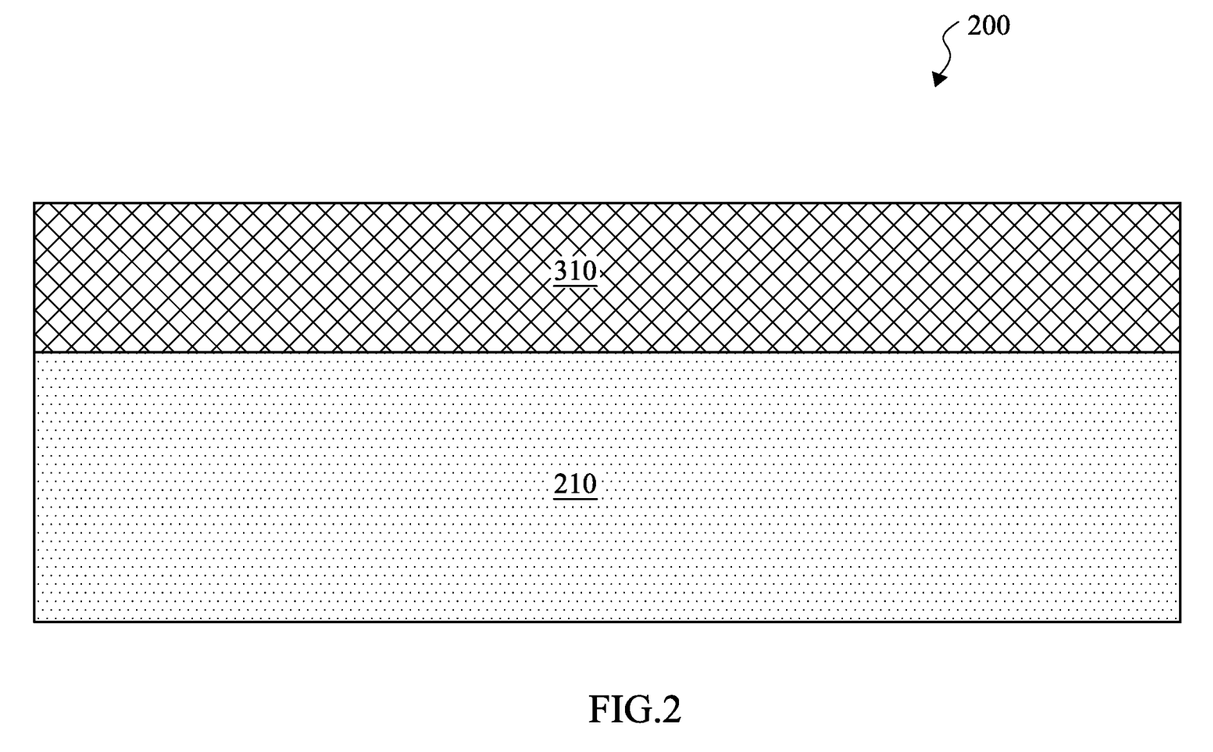
FIGS. 2, 3A, 3B, 4, 5 and 6 are cross-sectional views of an example semiconductor device in accordance with some embodiments.

Referring to FIGS. 1 and 2, the method 100 begins at step 102 by providing a substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include a dielectric substrate such as silicon oxide, silicon nitride, silicon oxynitride, a low-k dielectric, silicon carbide, and/or other suitable layers.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor and/or a capacitor formed in and/or on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of an STI may include etching a trench in the substrate 210 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, and/or other suitable techniques. The IL may include oxide, HfSiO and oxynitride and the HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 420 may include Ti, Ag, Al, TiAlN, TaC, TaCN, TaSiN, Mn, Zr, TiN, TaN, Ru, Mo, Al, WN, Cu, W, any suitable materials and/or a combination thereof.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Typically, the substrate 210 or film layers over the substrate 210 will be patterned by photolithography process. Photolithography process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. Baking processes may be performed before or after exposing the substrate, such as a post-exposure baking process. A developing process selectively removes the exposed or unexposed regions with a developing solution creating an exposure pattern over the substrate. As a resist is exposed to EUV light, a small amount of acid is produced within the exposed areas. This acid catalyzes the fragmentation of groups attached to the polymer chain (de-protection) of the resist during a post-exposure bake (PEB) step altering its chemical properties. Finally, the de-protected portion of the resist is dissolved in a liquid developer. A diffusion of the acid within the resist during the PEB step leads to blurring of the edges of the patterned areas and causes resolution limitation, line edge roughness (LER) and pattern collapse. The present disclosure provides a patterning process without using a resist and a subsequent developing process.

Referring again to FIGS. 1 and 2, method 100 proceeds to step 104 by forming a radiation-removable-material (RRM) layer 310 over the substrate 210. The RRM layer 310 will be removed when it is exposed to a radiation in a subsequent step. In the present embodiment, the RRM layer 310 may include an organic material having a non-cyclic structure and a cyclic structure, and a cyclic structure can be an aromatic, and a non-aromatic ring. It can contain a functional group to increase adhesion, like as —F, —Cl, —Br, —I, —PO(OH)2, —PO4, —BO3, —C2O4, —NO3, —SO3, —CO3, —S, —CN, —CH3COO, —NH2, —ClO4, —ClO3, —ClO2, —ClO, —COOH, —OH, —SH, —N3, —S(=O)—, imine, ether, vinyl ether, acetal, hemiacetal, ester, aldehyde, ketone, amide, sulfone, acetic acid, cyanide. The RRM layer 310 may be deposited by thermal oxidation chemical vapor deposition (CVD), atomic layer deposition (ALD), physical vapor deposition (PVD), thermal oxidation, spin-on, combinations thereof, or other suitable techniques.

Alternatively, the RRM layer 310 is formed by performing a hexamethyldisilizane (HMDS) treatment to modify a top portion (surface) of the substrate 210 into the RRM layer 310. In an embodiment, the HMDS treatment is performed to a top surface of the silicon oxide substrate 210. In HMDS treatment, the HMDS agent is introduced in vapor form in a chamber containing the silicon oxide substrate 210. The HMDS chemically removes the surface OH group by acting as a "hydroxyl getter". The HMDS first reacts with the water on the oxide surface to produce gaseous $NH_3$, oxygen, and an inert hexamethyldisiloxane. This produces a dehydrated surface. Next, additional HMDS (in presence of heat) reacts with the liberated oxygen to form a thrimethylsilyl oxide species which chemically bonds to the surface. These reactions continue until the entire surface of the oxide substrate 210 is covered with this species, or entire surface of the oxide substrate 210 is modified to the RRM layer 310, which is referred to as the HMDS RRM layer 310. In an embodiment, the HMDS treatment is performed in a time range from about 2 second to about 1000 second and in a temperature range from about 90° C. to about 150° C.

Figure 3A:
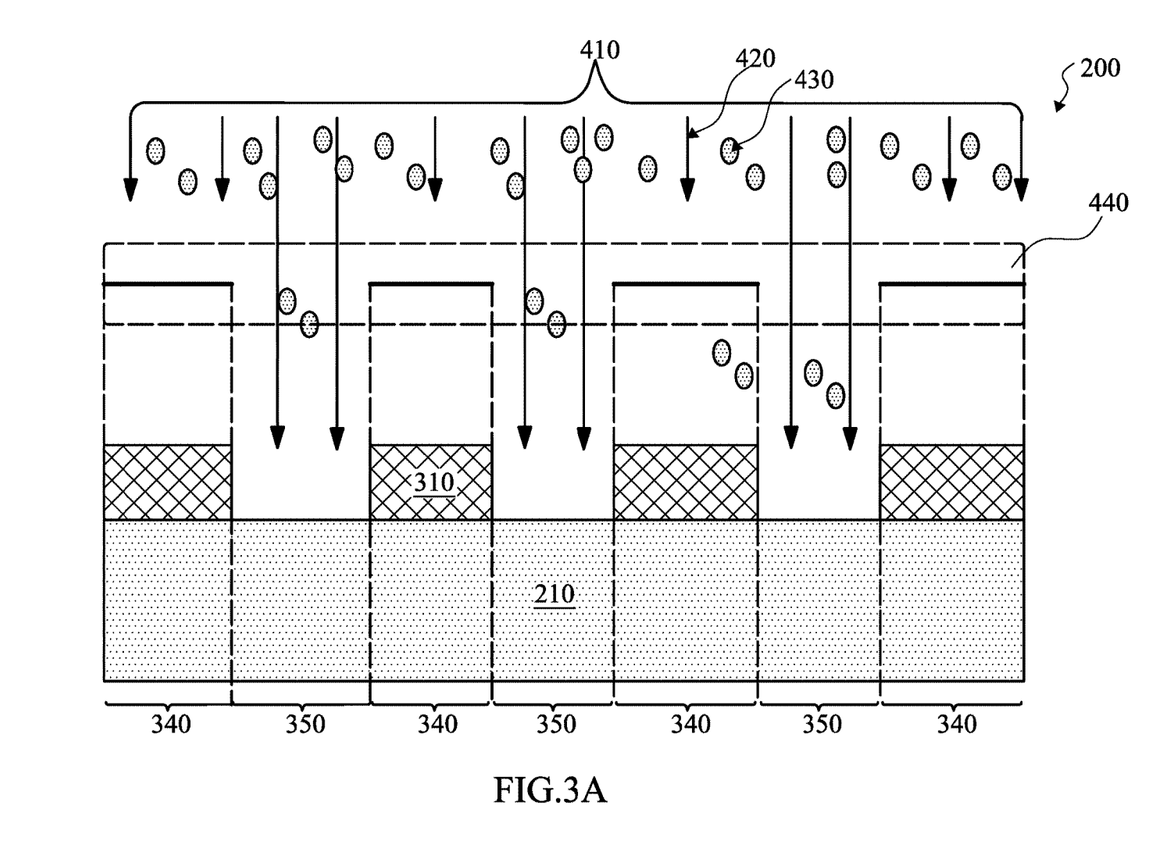

Referring to FIGS. 1 and 3A, method 100 proceeds to step 106 by exposing the RRM layer 310 to a radiation beam to form a patterned RRM layer 450 over the substrate 210. In the present embodiment, the RRM layer 310 is exposed to a radiation beam 420 from a light source 410 through a photomask (mask or reticle) 440.

Figure 3B:
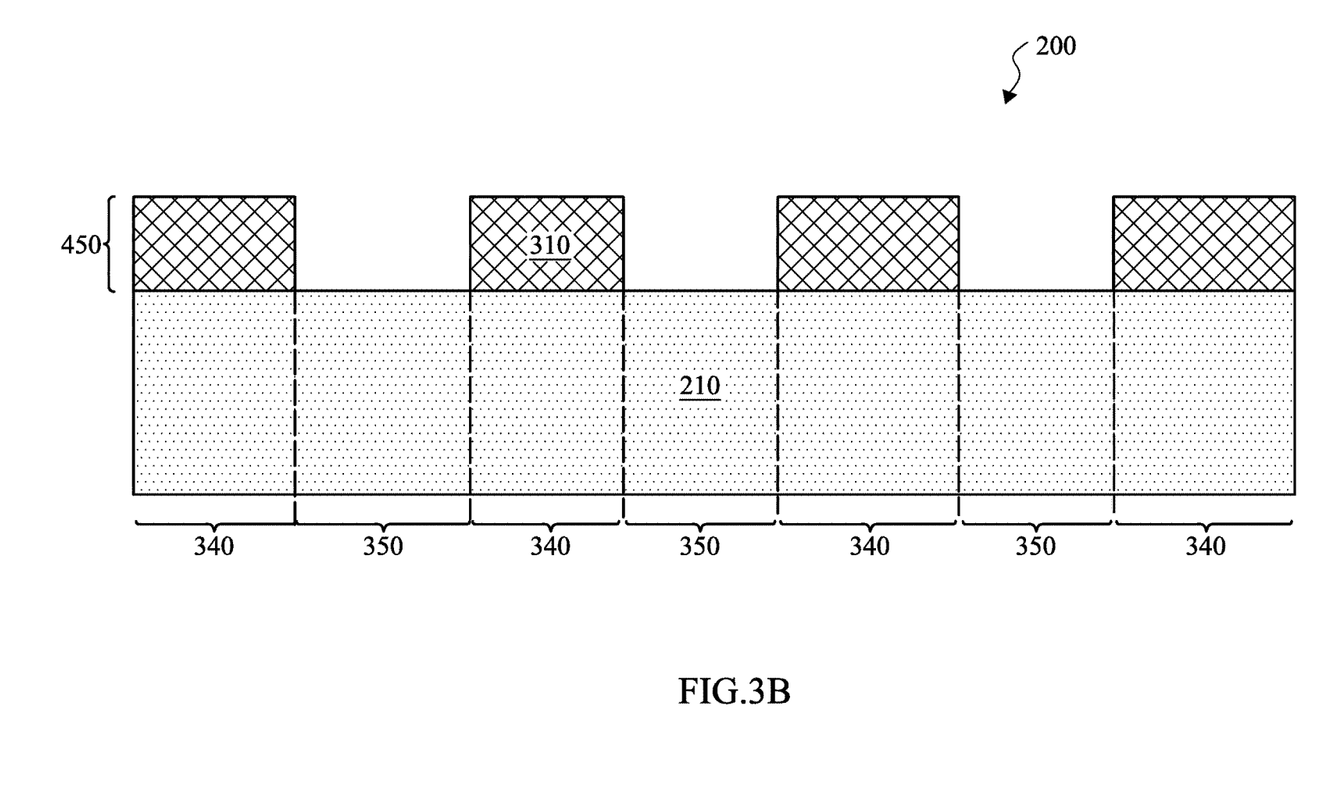

The photomask 440 has a predefined pattern (having a plurality of first regions 340 and a second region 350) designed for an IC product, based on a specification of the IC product to be manufactured. The patterns of the photomask 440 correspond to patterns of materials that make up the various components of the IC device to be fabricated. For example, a portion of the IC design layout includes various IC features, such as an active region, gate electrode, source and drain, metal lines or vias of an interlayer interconnection, and openings for bonding pads, to be formed in the substrate 210 and various material layers disposed on the substrate 210. In the first region 340, the radiation beam 420 is blocked by the photomask 440 to reach the RRM layer 310, referring to as unexposed region. While in the second region 350, the radiation beam 420 is not blocked by the photomask 440 and can pass through it to reach the RRM layer 310, referring to as an exposed region. As a result, in the exposed region 350, the RRM layer 310 receives the radiation beam 420 and is then removed while the RRM layer 310 in the unexposed region 340 does not receive the radiation beam 420 and remains. In other words, the patterned RRM layer 450 is formed with a pattern defined by the predefined pattern of the photomask 440, as shown in FIG. 3B. The patterned RRM layer 450 is formed such that the substrate 210 is covered by the RRM layer 310 in the unexposed region 340 and is exposed in the exposed region 350.

The light source 410 may be a variety of sources, including a Krypton Fluoride (KrF) excimer laser with wavelength of 248 nm, an Argon Fluoride (ArF) excimer laser with a wavelength of 193 nm, a Fluoride ($F_2$) excimer laser with a wavelength of 157 nm, or other light sources having a longer wavelength. The light source 410 may also include an optical source selected from the group consisting of ultraviolet (UV) source, deep UV (DUV) source, extreme UV (EUV) source, and X-ray source, and/or other suitable sources.

In the present embodiment, as shown in FIG. 3A, an EUV radiation beam 420 through the photomask 440, in a hydrogen gas 430 environment, is performed to the HMDS RRM layer 310 to remove the HMDS RRM layer 310 in the exposed region 350 and then forms the patterned HMDS RRM layer 450. As a result, the HMDS RRM layer 310 (the modified surface) in the in the unexposed region 340 remains and the oxide substrate without HMDS RRM layer 310 (the modified surface) is exposed in the exposed region 350. That is, unlike typically photolithography processes, RRM layer 310 is patterned without preforming a development step.

Figure 4:
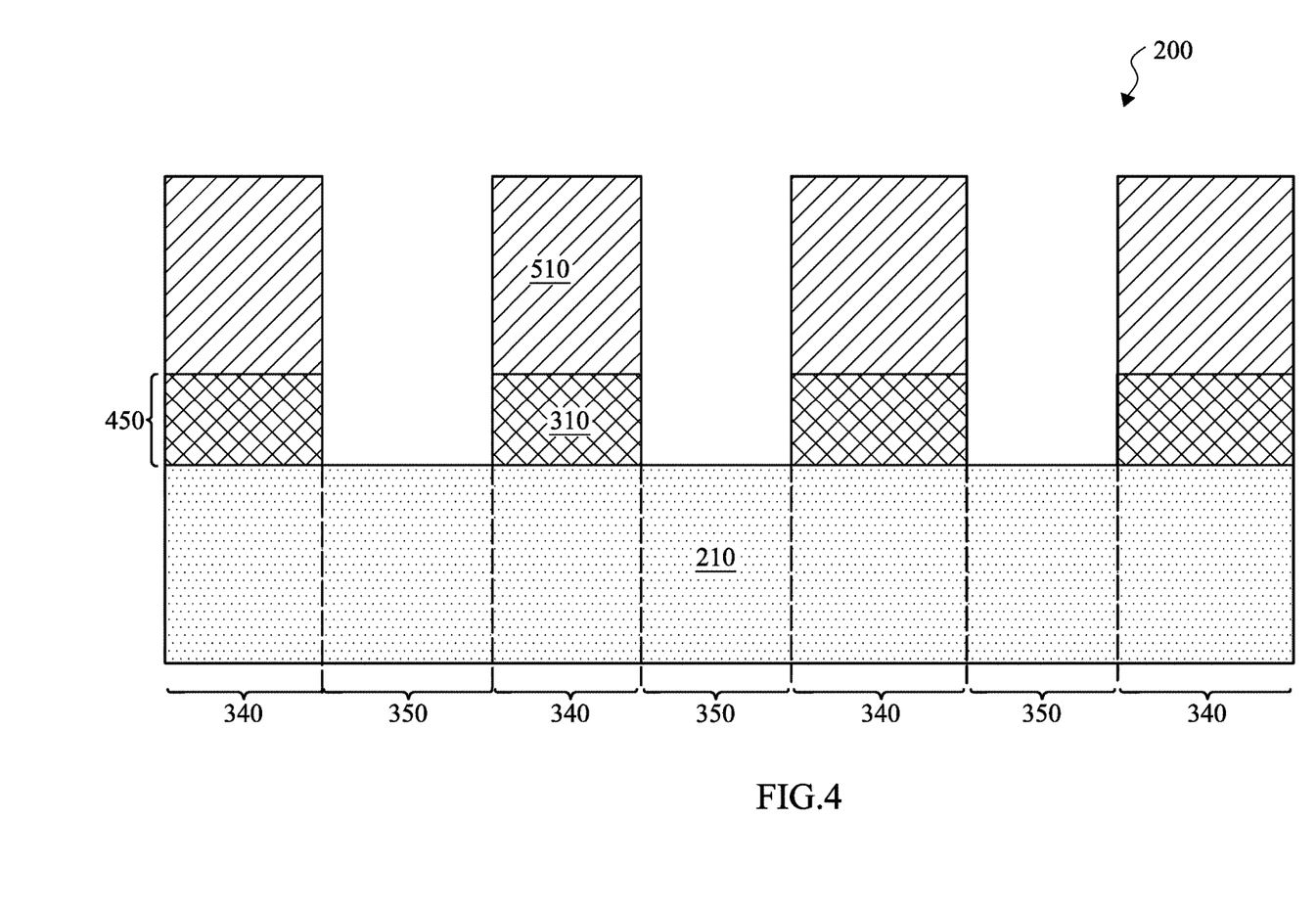

Referring to FIGS. 1 and 4, method 100 proceeds to step 108 by forming a selective-forming-layer (SFL) 510 over the remaining RRM layer 310 in the unexposed region 340 and leave the substrate 210 be exposed in the exposed region 350. In the present embodiment, the SFL 510 is self-assembled monolayers (SAMs). A chemical structure of SAM layer 510 may include a non-cyclic structure and a cyclic structure, aromatic, and a non-aromatic ring. It contains at least one monodentate phosphonic acid. In an embodiment, the SAMs 510 is formed by applying a solution of octadecylphosphonic acid (ODPA) to the oxide substrate 210 having the patterned HMDS RRM layer 450, then being rinsed by methanol and dried by compressed air. Therefore the SAMs 510 is referred to as ODPA SAM 510. For an example, the ODPA SAM 510 is formed by immersing the oxide substrate 210 into a solution of ODPA. For another example, the ODPA SAM 510 is formed by rinsing the oxide substrate 210 by a solution of ODPA.

Figure 5:
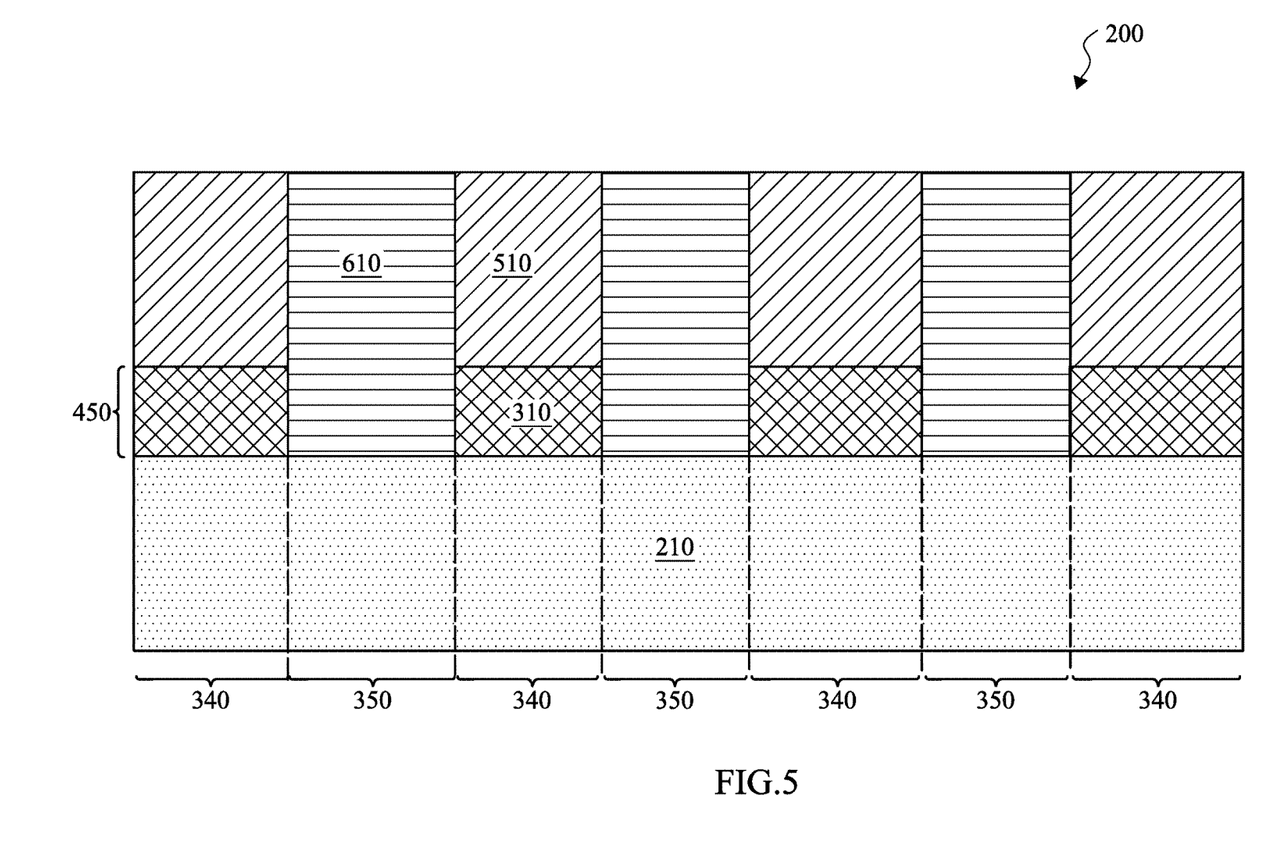

Referring to FIGS. 1 and 5, method 100 proceeds to step 110 by forming a material layer 610 over the exposed substrate 210 in the exposed region 350. In the present embodiment, the material layer 610 is formed by an area selective atomic layer deposition (ALD) technique or an area selective molecular layer deposition (MLD) technique, such that the material layer 610 is selectively deposited over exposed substrate 210 without depositing over the SFL 510.

The material layer 610 may include oxides, fluorides and organometallics of a metal such as Ce, La, Sb, Bi, Pb, Hf, Zr, Ti, Cr, W, Mo, Fe, Ru, Os, Co, Rh, Ir, Ni, Pd, Pt, Cu, Ag, Au, Zn, Cd, Al, Ga, Tl, Ge, Sn, Pb, and Bi. The ligand for organometallic complex may include a C3-C20 alkyl group with a functional group such as epoxy, azo compounds, alkyl halide, imine, alkene, alkyne, peroxide, ketone, aldehyde, allene, aromatic groups or heterocyclic groups. The aromatic structures may include phenyl, napthlenyl, phenanthrenyl, anthracenyl, phenalenyl, and other aromatic derivatives containing one to five-membered rings.

The material layer 610 may also include a metal such as Ce, La, Sb, Bi, Pb, Hf, Zr, Ti, Cr, W, Mo, Fe, Ru, Os, Co, Rh, Ir, Ni, Pd, Pt, Cu, Ag, Au, Zn, Cd, Al, Ga, Tl, Ge, Sn, Pb, Bi, and/or other suitable metal.

The material layer 610 may also include polymers having a chemical structure such as a non-cyclic structure and a cyclic structure. A cyclic structure may include an aromatic and a non-aromatic ring. The polymer may contain a functional group like as —F, —Cl, —Br, —I, —PO(OH)2, —PO4, —BO3, —C2O4, —NO3, —SO3, —CO3, —S, —CN, —CH3COO, —NH2, —ClO4, —ClO3, —ClO2, —ClO, —COOH, —OH, —SH, —N3, —S(=O)—, imine, ether, vinyl ether, acetal, hemiacetal, ester, aldehyde, ketone, amide, sulfone, acetic acid, yanide, and/or other suitable polymer chemical structures.

In the present embodiment, material layer 610 is a metal oxide layer 610 that is selectively deposited over the oxide substrate 210 by an ALD technique.

Figure 6:
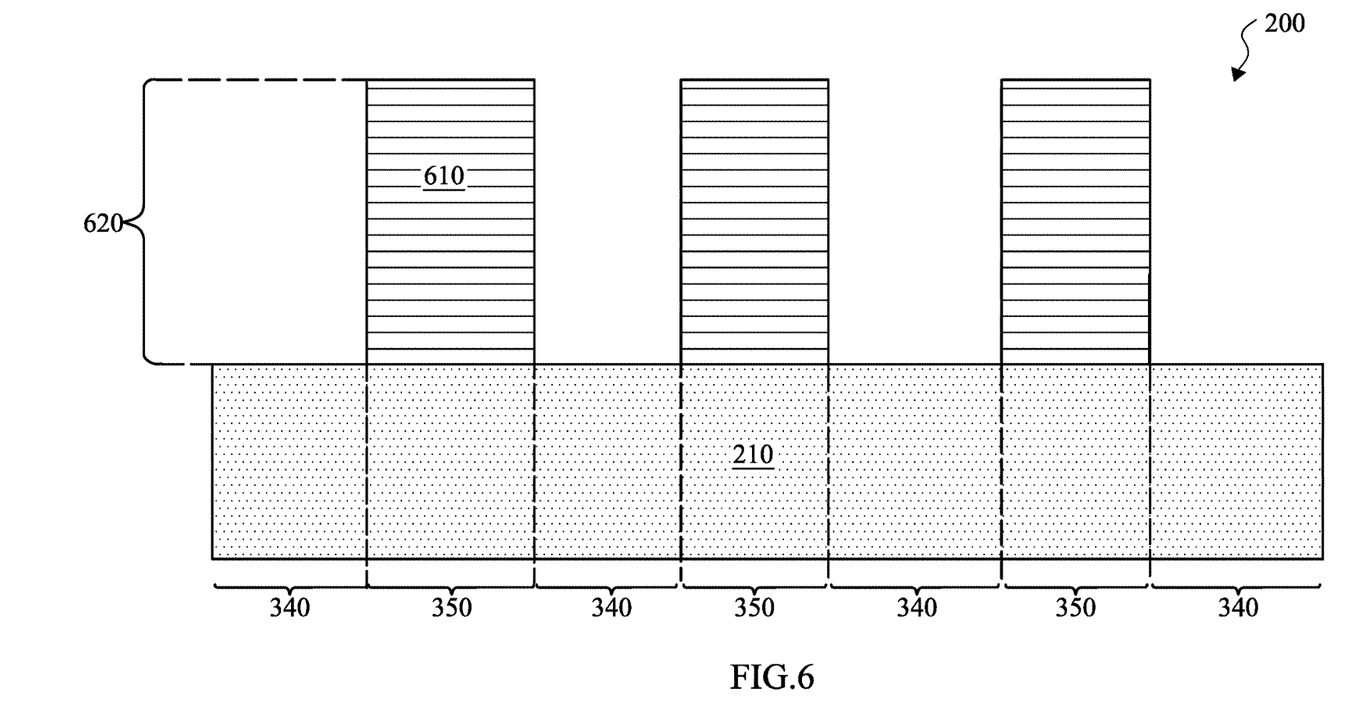

Referring to FIGS. 1 and 6, method 100 proceeds to step 112 by selectively removing the SFL 510 and the remaining RRM layer 310 from the unexposed region 340. The SFL 510 and the remaining RRM layer 310 may be removed by a selective wet etch, a selective dry etch, and/or combination thereof. As an example, a selective wet etching solution may include TMAH, HNO$_3$, NH$_4$OH, KOH, HF, HCl, NaOH, H$_3$PO$_4$, and/or other suitable wet etching solutions, and/or combinations thereof. Alternatively, a selective dry etching process may implement chlorine-containing gas (e.g., Cl$_2$, CHCl$_3$, CCl$_4$, and/or BCl$_3$), bromine-containing gas (e.g., HBr and/or CHBr$_3$), iodine-containing gas, fluorine-containing gas (e.g., CF$_4$, SF$_6$, CH$_2$F$_2$, CHF$_3$, and/or C$_2$F$_6$), and/or other suitable gases and/or plasmas, and/or combinations thereof.

In the present embodiment, the ODPA SAM 510 and the HMDS RRM layer 310 is selectively removed by a TMAH wet etch.

After moving the removing the SFL 510 and the remaining RRM layer 310, the material layer 610 remains over the substrate with a pattern, referred to as a patterned material layer 620, which is the pattern of the photomask 440 designed for. The patterned material layer 620 is formed such that the material layer 610 is formed over the exposed region 350 but not over the unexposed region 340.

Additional steps can be provided before, during, and after the method 100, and some of the steps described can be replaced, eliminated, or moved around for additional embodiments of the method 100.

Based on the above, the present disclosure offers methods for patterning a material layer by EUV exposure, SAM formation and ALD/MLD deposition. The method employs performing an HMDS treatment to modify a top surface of substrate and performing an EUV exposure process in a hydrogen environment to remove the modified top surface of the substrate in a selected region. That is, the method achieves patterning a material layer without a typically developing process that includes applying a development solution after exposing a substrate. The method further demonstrates patterning a material layer with improved resolution and reduced pattern collapse issue.

The present disclosure provides many different embodiments of fabricating a semiconductor device that provide one or more improvements over existing approaches. In one embodiment, a method for fabricating a semiconductor device includes forming a radiation-removable-material (RRM) layer over a substrate and removing a first portion of the RRM layer in a first region of the substrate by exposing the first portion of the RRM layer to a radiation beam. Thus, a second portion of the RRM layer in a second region of the substrate remains after the removing of the first portion of the RRM layer in the first region. The method also includes forming a selective-forming-layer (SFL) over the second portion of the RRM layer in the second region of the substrate and forming a material layer over the first region of the substrate.

In another embodiment, a method includes forming a radiation-removable-material (RRM) layer over a substrate and exposing the RRM layer by an extreme ultraviolet (EUV) beam through a photomask to remove a first portion of the RRM layer in a first region of substrate. Thus, a second portion of the RRM layer in a second region of the substrate remains after the removing of the first portion of the RRM layer in the first region. The method also includes forming self-assembled monolayers (SAMs) over the second portion of RRM layer in the second region and forming a material layer over the first region of the substrate.

In yet another embodiment, a method includes performing a hexamethyldisilizane (HMDS) treatment to a dielectric substrate to modify a surface of the dielectric substrate and exposing the dielectric substrate to an extreme ultraviolet (EUV) beam through a photomask in a hydrogen environment to remove a first portion of the modified surface in a first region of the dielectric substrate. Thus, a second portion of the modified surface in a second region of the dielectric substrate remains after the removing of the first portion of the modified surface in the first region. The method also includes forming self-assembled monolayers (SAMs) over the second portion of the modified surface in the second region and forming a metal oxide layer over the first region of the dielectric substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a radiation-removable-material (RRM) layer over a substrate;
   removing a first portion of the RRM layer in a first region of the substrate by exposing the first portion of the RRM layer to a radiation beam, wherein a second portion of the RRM layer in a second region of the substrate remains after the removing of the first portion of the RRM layer in the first region;
   forming a selective-forming-layer (SFL) over the second portion of the RRM layer in the second region of the substrate; and
   forming a material layer over the first region of the substrate.

2. The method of claim 1, wherein removing the first portion of the RRM layer in the first region of the substrate by exposing the first portion of the RRM layer to the radiation beam includes exposing the first portion of the RRM layer by the radiation beam through a photomask, wherein the photomask blocks the radiation beam in the second region of the substrate.

3. The method of claim 1, wherein the radiation beam is an extreme ultraviolet (EUV) beam.

4. The method of claim 1, wherein forming the RRM layer over the substrate includes performing a hexamethyldisilizane (HMDS) treatment to modify a portion of the substrate.

5. The method of claim 4, wherein the substrate is a dielectric substrate.

6. The method of claim 5, wherein removing the first portion of the RRM layer in the first region of the substrate by exposing the first portion of the RRM layer to the radiation beam includes exposing the dielectric substrate to an extreme ultraviolet (EUV) beam in a hydrogen environment.

7. The method of claim 1, wherein forming the SFL over the RRM layer in the second region includes forming self-assembled monolayers (SAMs).

8. The method of claim 7, wherein forming the SAMs includes applying a solution of octadecylphosphonic acid (ODPA) to the substrate.

9. The method of claim 1, wherein forming the material layer over the substrate in the first region includes selectively forming the material layer by either atomic layer deposition (ALD) or molecular layer deposition (MLD).

10. The method of claim 1, wherein forming the material layer over first region of the substrate includes forming a metal oxide layer over the first region of the substrate.

11. The method of claim 1, further comprising removing the SFL and RRM layer in the second region of the substrate after forming the material layer over the first region of the substrate.

12. A method comprising:
   forming a radiation-removable-material (RRM) layer over a substrate;
   exposing the RRM layer by an extreme ultraviolet (EUV) beam through a photomask to remove a first portion of the RRM layer in a first region of substrate, wherein a second portion of the RRM layer in a second region of the substrate remains after the removing of the first portion of the RRM layer in the first region;
   forming self-assembled monolayers (SAMs) over the second portion of RRM layer in the second region; and
   forming a material layer over the first region of the substrate.

13. The method of claim 12, wherein the substrate is an oxide substrate, and
   wherein forming the RRM layer over the substrate includes performing hexamethyldisilizane (HMDS) treatment to the oxide substrate.

14. The method of claim 13, wherein exposing the substrate by the EUV beam through the photomask includes exposing the oxide substrate by the EUV beam in a hydrogen environment.

15. The method of claim 14, wherein forming SAMs over the RRM layer in the second region includes applying a solution of octadecylphosphonic acid (ODPA) to the oxide substrate.

16. The method of claim 12, wherein forming the material layer over the first region of the substrate includes forming a metal oxide layer over the first region of the substrate.

17. The method of claim 12, further comprising removing the SAMs in the second region of the substrate after forming the material layer over the first region of the substrate.

18. A method comprising:
   performing a hexamethyldisilizane (HMDS) treatment to an dielectric substrate to modify a surface of the dielectric substrate;
   exposing the dielectric substrate to an extreme ultraviolet (EUV) beam through a photomask in a hydrogen environment to remove a first portion of the modified surface in a first region of the dielectric substrate, wherein a second portion of the modified surface in a second region of the dielectric substrate remains after the removing of the first portion of the modified surface in the first region;
   forming a self-assembled monolayers (SAMs) over the second portion of the modified surface in the second region; and
   forming a metal oxide layer over the first region of the dielectric substrate.

19. The method of claim 18, wherein forming SAMs includes applying a solution of octadecylphosphonic acid (ODPA) to the dielectric substrate having the modified surface.

20. The method of claim 18, further comprising removing the SAMs in the second region after forming the metal oxide layer over the first region of the dielectric substrate.

\* \* \* \* \*